(12) United States Patent
Konsek

(10) Patent No.: US 8,766,395 B2
(45) Date of Patent: Jul. 1, 2014

(54) SCHOTTKY DEVICE

(75) Inventor: Steven Konsek, Austin, TX (US)

(73) Assignee: Qunano AB, Lund (SE)

( * ) Notice: Subject to any disclaimer, the term of this patent is extended or adjusted under 35 U.S.C. 154(b) by 0 days.

(21) Appl. No.: 13/258,720

(22) PCT Filed: Mar. 25, 2010

(86) PCT No.: PCT/SE2010/050332
§ 371 (c)(1),
(2), (4) Date: Sep. 22, 2011

(87) PCT Pub. No.: WO2010/110733
PCT Pub. Date: Sep. 30, 2010

(65) Prior Publication Data
US 2012/0012968 A1    Jan. 19, 2012

(30) Foreign Application Priority Data

Mar. 25, 2009 (SE) ........................ 0950186

(51) Int. Cl.
*H01L 29/47* (2006.01)
(52) U.S. Cl.
USPC ............ 257/472; 257/471; 438/570; 438/572
(58) Field of Classification Search
CPC ... H01L 29/40; H01L 29/47; H01L 29/66143; H01L 29/66212; H01L 29/93
USPC .................... 257/471–486, 734–786, E51.04; 136/243–265; 977/762–764, 810–830
See application file for complete search history.

(56) References Cited

U.S. PATENT DOCUMENTS

| 6,768,146 B2 | 7/2004 | Yoshida |
| 7,335,908 B2 | 2/2008 | Samuelson et al. |

(Continued)

FOREIGN PATENT DOCUMENTS

| CA | 2515173 A1 | 1/2006 |
| EP | 1947700 A2 | 7/2008 |
| WO | WO2004109815 A1 | 12/2004 |
| WO | WO2005124872 A1 | 12/2005 |

(Continued)

OTHER PUBLICATIONS

International Preliminary Report on Patentability issued in PCT Application PCT/SE2010/050332, mailed Oct. 6, 2011.

(Continued)

*Primary Examiner* — Matthew Landau
*Assistant Examiner* — Mark Hatzilambrou
(74) *Attorney, Agent, or Firm* — The Marbury Law Group PLLC

(57) ABSTRACT

A device includes a Schottky barrier formed by a metal-semiconductor junction between a semiconductor nanowire and a metal contact. The metal contact at least partly encloses a circumferential area of each nanowire along the length thereof. The nanowire includes a low doped region that is part of the metal-semiconductor junction. The device can be fabricated using a method where two different growth modes are used, the first step including axial growth from a substrate giving a suitable template for formation of the metal-semiconductor junction, and the second step including radial growth enabling control of the doping levels in the low doped region.

19 Claims, 3 Drawing Sheets

(56) References Cited

U.S. PATENT DOCUMENTS

| | | | |
|---|---|---|---|
| 2003/0049916 A1* | 3/2003 | Surya et al. | 438/478 |
| 2006/0292839 A1 | 12/2006 | Yi et al. | |
| 2007/0137697 A1* | 6/2007 | Kempa et al. | 136/256 |
| 2008/0036038 A1* | 2/2008 | Hersee et al. | 257/615 |
| 2009/0008631 A1* | 1/2009 | Hurkx et al. | 257/25 |
| 2009/0065811 A1* | 3/2009 | Chang et al. | 257/197 |

FOREIGN PATENT DOCUMENTS

| | | | | |
|---|---|---|---|---|
| WO | WO2007021069 | * | 2/2007 | H01L 33/00 |
| WO | WO2007021069 A1 | | 2/2007 | |
| WO | WO2007086009 | * | 8/2007 | H01L 29/06 |
| WO | WO2007086009 A1 | | 8/2007 | |
| WO | WO 2008/034850 A2 | | 3/2008 | |
| WO | WO 2008/079077 A2 | | 7/2008 | |

OTHER PUBLICATIONS

International Search Report issued in PCT/SE2010/050332, mailed Jul. 7, 2010.

State Intellectual Property Office, P.R. China, First Office Action, issued Nov. 22, 2013, in corresponding Chinese Application No. 201080022799, and Search Report.

Extended European Search Report received in connection with European application No. 10756429.6; mail date of May 19, 2014.

Hwang, Chanoh et al., "The formation and characterization of electrical contacts (Schottky and Ohmic) on gallium nitride nanowires", J. Phys. D: Appl. Phys., vol. 41, (2008) 105103 (5 pgs.).

* cited by examiner

SCHOTTKY DEVICE

CROSS-REFERENCE TO OTHER APPLICATIONS

This application is a national phase application under 35 U.S.C. §371 of international application PCT/SE2010/050332 (filed Mar. 25, 2010) which claims priority to Swedish Application 0950186-7 (filed Mar. 25, 2009).

TECHNICAL FIELD OF THE INVENTION

The present invention relates to devices comprising Schottky barriers. In particular the invention relates to devices comprising a Schottky barrier formed by a metal-semiconductor junction between a semiconductor nanowire and a metal contact.

BACKGROUND OF THE INVENTION

Among metal-semiconductor contacts, there are two main groups: ohmic contacts and Schottky contacts. An ohmic contact is referred to as a metal-semiconductor contact that has negligible contact resistance relative to the series resistance of the semiconductor and a small voltage drop over the metal-semiconductor contact as compared to the total voltage drop across a device comprising the metal-semiconductor contact. A Schottky contact comprises a rectifying metal-semiconductor junction, referred to as a Schottky barrier or a Schottky diode. The barrier height is determined by the difference between the work function of the metal part and the electron affinity of the semiconductor part of the junction.

The Schottky diode has many advantages over conventional pn diodes, one of them being that it is a majority carrier device, in contrast to pn diodes where current transport is due to minority carriers. Thus the device exhibits no minority carrier storage effects, making it a very attractive choice in high speed applications. In addition, since the Schottky diode is a majority carrier device and the current flow mechanism is that of thermionic emission over a potential barrier, the turn-on voltage is defined almost entirely by the metal work function, the electron affinity of the semiconductor and surface states at the junction. This gives lower low turn-on voltage and higher reverse-saturation current density than in a pn diode.

Wide-bandgap semiconductors are particularly suitable for Schottky diodes. When compared to Si they offer improved performance in terms of breakdown voltage, lower leakage currents, higher temperature stability, faster reverse recovery times and positive temperature coefficients of resistance. The latter is useful for preventing thermal runaway in parallel diode applications. Taking all those advantages in consideration, it is understood that widespread adoption of wide-bandgap Schottky diodes would mean significant improvement in efficiency and lower power consumption in applications such as for example switch-mode power supplies. Another advantage is that the total package size can be made smaller due to the possibility to reduce the size of heat sinks, since wide-bandgap Schottky diodes can operate at higher temperatures as compared to the Si counterparts.

Among the wide-bandgap semiconductors available, there is a particular interest for SiC and GaN in Schottky diode applications. High performance Schottky diodes have been described for example in CA2515173 and EP1947700, where the diodes are manufactured from epitaxial GaN grown on a GaN substrate and from epitaxial AlGaN grown on a SiC substrate. In addition, U.S. Pat. No. 6,768,146 describes Schottky diodes made from GaN grown on sapphire substrates. However, problem arises when using the material combinations described. The most significant issue is the cost. These devices become very expensive to manufacture due to the high cost of the substrates. In addition to that, SiC requires very high growth temperatures, over 1500° C., which also significantly increases production cost.

Recently Schottky diodes comprising nanowires as part of the metal-semiconductor junction has been demonstrated. WO 2005/124872 discloses a Schottky diode formed by semiconductor nanowires of single conductivity type grown on a substrate and a metal contact arranged on the opposed end of the semiconductor nanowires. WO 2004/109815 discloses Schottky diodes comprising arrays of semiconductor nanowires with metal deposited on the tips thereof in order to form a metal-semiconductor junction. In WO 2007/021069 a metal contact layer is formed on top of an array of semiconductor nanowires with pn junctions in order to form a Schottky contact. These nanowire Schottky diodes benefit from the small cross sectional area of the nanowires to accomplish a small device area and inevitably also from using wide-bandgap semiconductors such as GaN. Moreover, it is known from WO 2007/021069 that problems caused by lattice mismatch due to GaN growth can be avoided by using nanowires.

SUMMARY OF THE INVENTION

The prior art has drawbacks with regard to being able to produce wide bandgap Schottky diodes.

The object of the present invention is to overcome at least some of the drawbacks of the prior art. This is achieved by device and a method as defined in the independent claims.

A device according to the invention comprises a Schottky barrier formed by a metal-semiconductor junction between a semiconductor nanowire and a first metal contact. The first metal contact at least partly encloses a circumferential area of each semiconductor nanowire along the length thereof. Hence the metal-semiconductor junction is at least partly in the radial direction of the semiconductor nanowire.

The semiconductor nanowire is also contacted via the base of the nanowire. This can be done with a highly doped buffer layer, e.g. a highly doped III-V layer on a Si substrate, from which the nanowire is grown.

The semiconductor nanowire comprises a lowly doped region that is part of the metal-semiconductor junction. This lowly doped region can comprise of an axial nanowire segment of the nanowire, the entire nanowire or in a core-shell configuration with a highly doped nanowire core and the lowly doped region comprised in the shell.

In the core-shell configuration the shell surrounds the nanowire core at least in the circumferential area that is enclosed by the first metal contact, and the nanowire core has a significantly higher doping level than the shell such that essentially the nanowire core functions as a conductor and the shell or part thereof functions as a depletion region of the Shottky barrier. Hence the metal-semiconductor has a radial design.

A radial design can also be accomplished with a semiconductor nanowire comprising a first segment and a second segment. The second segment is lowly doped and corresponds to the above mentioned lowly doped region which contributes to the formation of the metal-semiconductor junction. The first segment is highly doped to act as a conductor connecting to the metal-semiconductor junction.

The core-shell configuration with the lowly doped shell layer can be accomplished by a method according to the invention. The method is based on using two different growth modes, the first giving a suitable template for formation of the metal-semiconductor junction and the second step enabling control of the doping levels in the lowly doped region.

A method for forming a device comprising a Schottky barrier formed by a metal-semiconductor junction between a semiconductor nanowire and a metal contact according to the present invention comprises the steps of:

in a first step, axially growing a nanowire core in order to form a template for formation of the metal-semiconductor junction;

in a second step, switching growth mode, and radially growing a shell on the nanowire core; and providing a first metal contact on the shell.

Thanks to the invention it is possible to fabricate wide-bandgap Schottky diodes at a low cost and yet maintain a high reliability. In particular the invention enables the possibility to fabricate close to defect free wide-bandgap Schottky diodes.

It is a further advantage of the invention that the material system and the technique used makes it possible to fabricate Schottky diodes with very high yield.

It is yet further an advantage of the invention that it increases the possibility to integrate standard Si micro electronic devices and wide-bandgap semiconductor two-terminal devices such as Schottky diodes on the same substrate. Consequently, a standard Si substrate can be used for the fabrication of standard Si micro electronic devices as well as of high quality, defect free III-V semiconductor electronics.

An example of the integration on a standard Si-wafer may be that a first part or parts of the wafer, nanowires are arranged to form Schottky diodes. On a second part or parts of the wafer, standard semiconductor components like for example MOS-transistors, field effect transistors (FETs), application specific integrated circuits (ASICs) as well as resistors and capacitors may be arranged. This offers the possibility to fully integrate high performance nanowire devices and standard semiconductor electronics on a standard Si-substrate, although keeping the production cost on a reasonable level.

Further embodiments of the invention are defined in the dependent claims. Other objects, advantages and novel features of the invention will become apparent from the following detailed description of examples of embodiments of the invention when considered in conjunction with the accompanying drawings and claims.

BRIEF DESCRIPTION OF THE DRAWINGS

Preferred embodiments of the invention will now be described with reference to the accompanying drawings, wherein FIG. 1 schematically illustrates a nanowire having a limited extension in the growth direction in accordance with the present invention, FIG. 2 schematically illustrates a nanowire structure comprising a Schottky barrier with a first contact on top of the nanowires and a second contact connected to the nanowires through the substrate in accordance with the present invention, FIG. 3 schematically illustrates a nanowire structure comprising a radial Schottky barrier in a core-shell configuration in accordance with the present invention, FIG. 4 schematically illustrates a nanowire structure comprising a radial Schottky barrier with a nanowire having a longitudinal heterostructure in accordance with the present invention, and FIG. 5 and FIG. 6 schematically illustrate modifications of the nanowire structures of FIG. 3 and FIG. 4, respectively.

DETAILED DESCRIPTION OF EMBODIMENTS

The embodiments to be described in the following are all based on the use of nanowires and for the purpose of this application the term nanowire is to be interpreted as a structure having a shape that is of nanometer dimensions in its width or diameter. Such structures are commonly also referred to as nanowhiskers, one-dimensional nano-elements, nanorods, etc. However, nanowires can also benefit from some of the unique properties of nanowires without having a non-elongated shape. By way of example, non-elongated nanowires, e.g. of pyramidal shape or as thin as only a few epitaxial layers, can be formed on a substrate material having relatively large defect density in order to provide defect-free templates for further processing.

The nanowires of the present invention are grown on a substrate, often referred to as wafer in the field of microelectronics. The substrate may include one or more surface layers on the surface thereof. These layers are commonly referred to as a buffer layer and in this application the term "substrate" interchangeably refer to a single substrate, such a crystalline Si substrate, or the substrate and the buffer layer together.

The nanowires are preferably grown using selective area growth techniques such as those described in WO 2007/102781 and WO 2008/085129 where the nanowires are grown without the use of a particle as a catalyst. The most widespread process of nanowire formation on substrates by particle assisted growth or the so-called VLS (vapour-liquid-solid) mechanism described in U.S. Pat. No. 7,335,908, as well as different types of Chemical Beam Epitaxy and Vapour Phase Epitaxy methods, which are well known, can also be used.

Nearly defect free nanowires of wide-bandgap materials, such as GaN and AlGaN have been grown on different substrates, even Si substrates. The nanowires can be grown directly on the substrate or by first providing a buffer layer of a III-V material on the substrate, and subsequently growing the nanowires on the buffer layer. A termination layer on the substrate provided by e.g. a pre-flow of a III-material precursor as shown in WO 2009/054804 may assist in obtaining vertically aligned semiconductor nanowires on Si.

Basically a device according to the present invention comprises at least one semiconductor nanowire 1 and a first metal contact 5, where a metal-semiconductor junction between the semiconductor nanowire 1 and the first metal contact 5 forms a Schottky barrier.

Figure 1:
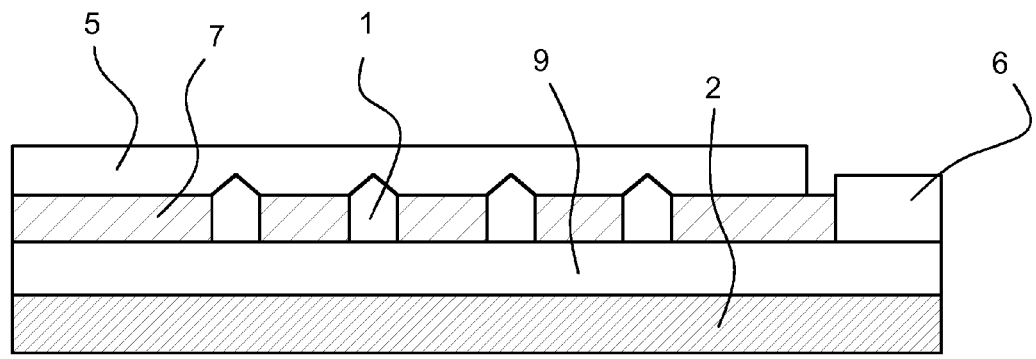

Referring to FIG. 1, a device according to one embodiment of the present invention comprises at least one semiconductor nanowire 1 grown from a substrate 2, thus protruding from the substrate 2, and connected to a conducting element acting as a conductor at the base of the semiconductor nanowire 1 and a first metal contact 5 arranged on the opposed end of the semiconductor nanowire 1. The semiconductor nanowire 1 at least in a segment adjacent to the metal-semiconductor junction has a low doping level.

By way of example, as illustrated in FIG. 1, the device comprises an array of semiconductor nanowires 1 with low doping level, e.g. a n-type III-V material, substantially axially grown from a common buffer layer 9 with substantially higher doping level, e.g. a n++-type III-V material, than the semiconductor nanowires 1 and with a first metal contact 5 arranged on an end portion of the semiconductor nanowires 1 opposite the substrate 2. This forms a sequence of metal (Me) contact//n-type III-V nanowire/n++-type III-V buffer layer, the double slash denoting the position of the metal-semiconductor junction. A dielectric spacer 7 is arranged between the first metal contact 5 and the substrate 2 and fills the gap between the semiconductor nanowires 1. The buffer layer 9 functions as the conductor connecting to each metal-semiconductor junction. By way of example a two terminal device is formed by arranging a second contact 6, preferably forming an ohmic contact, on the highly doped buffer layer 9. The dielectric spacer 7 may comprise a dielectric growth mask (not shown) used in the growth of the semiconductor nanowires 1.

Although exemplified with a homogenously doped semiconductor nanowire 1 the nanowire may comprise one or more segments of different composition and/or doping. For example the nanowire 1 may be grown with a first segment with a high doping level adjacent to the substrate and a second segment with a low doping level adjacent to the metal-semiconductor junction, such that the first segment acts as a conductor connecting to the metal-semiconductor junction.

The semiconductor nanowire or nanowires 1 may also be contacted by other means than a buffer layer 9. For example a wrap around contact may be used at the base of the nanowires 1 or the substrate 2 may be doped to provide a conductor extending laterally or through the substrate 2.

The first metal contact 5 of the above embodiment may be arranged on the free end surface of the each nanowire 1, which typically is facetted or planarised, or it extends out onto the circumferential area of each nanowire 1, thereby enclosing an end portion of each nanowire 1. The term "circumferential area" is for the purpose of this application to be interpreted as at the curved sidewall of the semiconductor nanowire.

Figure 2:
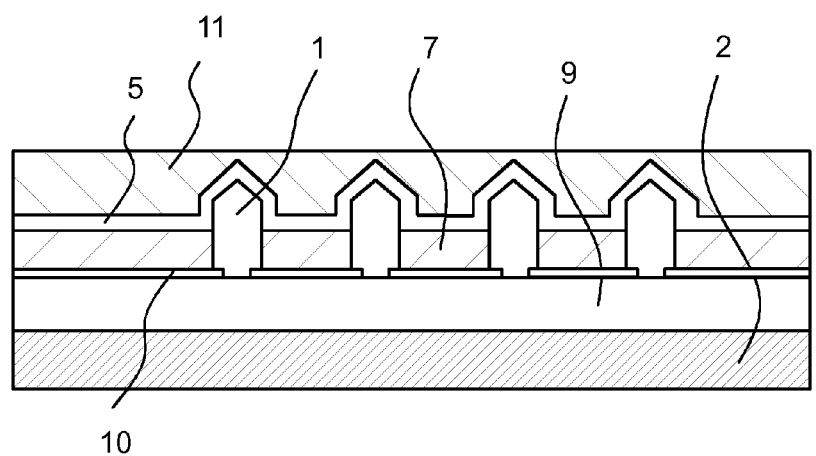

FIG. 2 schematically illustrates one example of a device in accordance with the invention comprising an array of semiconductor nanowires 1 made of n-type GaN, each semiconductor nanowire 1 grown from a common buffer layer 9 made of n++ type GaN on a substrate 2 made of Si. A first metal contact 5 is arranged on the end portions of the semiconductor nanowires 1 opposite to the substrate 2 in order to form the Schottky barrier. Platinum (Pt) and Nickel (Ni) have proven to form high quality Schottky contacts to n-type GaN, and either of these may be used, however not limited to this. In this particular example a growth mask 10 has been used on the buffer layer 9 to position the semiconductor nanowires 1 and to define their diameter. The highly doped buffer layer 9 acts as a common electrode for the semiconductor nanowires 1 and a second contact (not shown), preferably adapted to form an ohmic contact, is arranged somewhere on the buffer layer 9 or the buffer layer 9 is electrically connected by other means. Although the dielectric growth mask is arranged on the buffer layer 9 and isolates the first metal contact 5 from the buffer layer 9, a dielectric spacer is preferably arranged to give additional insulation to allow for high voltage operation, i.e., more than 100V.

Many III-V materials, by way of example GaN, which are of special interest for forming Schottky diodes usually comprise many threading dislocations and stacking faults due to the lack of compatible substrates. For prior art GaN based devices SiC, $Al_2O_3$, and Si are most commonly used. These materials are unfortunately lattice mismatched with respect to GaN. Also, they suffer from a high thermal expansion mismatch with respect to GaN. Moreover, SiC and $Al_2O_3$ are expensive and not yet commercially available in large wafer sizes. Thanks to the small footprint of nanowires they accommodate crystal discrepancies by relaxing to optimal crystal size in all three dimensions. For example, U.S. Pat. No. 7,335,908 discloses the opportunity to use this to grow heavily lattice mismatched sequences in the axial direction of a nanowire and it has been shown that selectively grown GaN nanowires form crystalline structures with substantially no threading dislocations or stacking faults. In this sense the semiconductor nanowires according to the present invention can be considered to be fundamentally better templates for forming metal-semiconductor junctions than common planar substrates. Furthermore, it has been noted that the amount of threading dislocations or stacking faults of GaN nanowires seem to be much smaller than in the GaN bulk material they are grown on. Thus the device performance can be decoupled from deteriorating properties of the buffer layer 9 or the substrate 2. Although exemplified with GaN this applies to other wide-bandgap III-V semiconductors as well.

Figure 3:
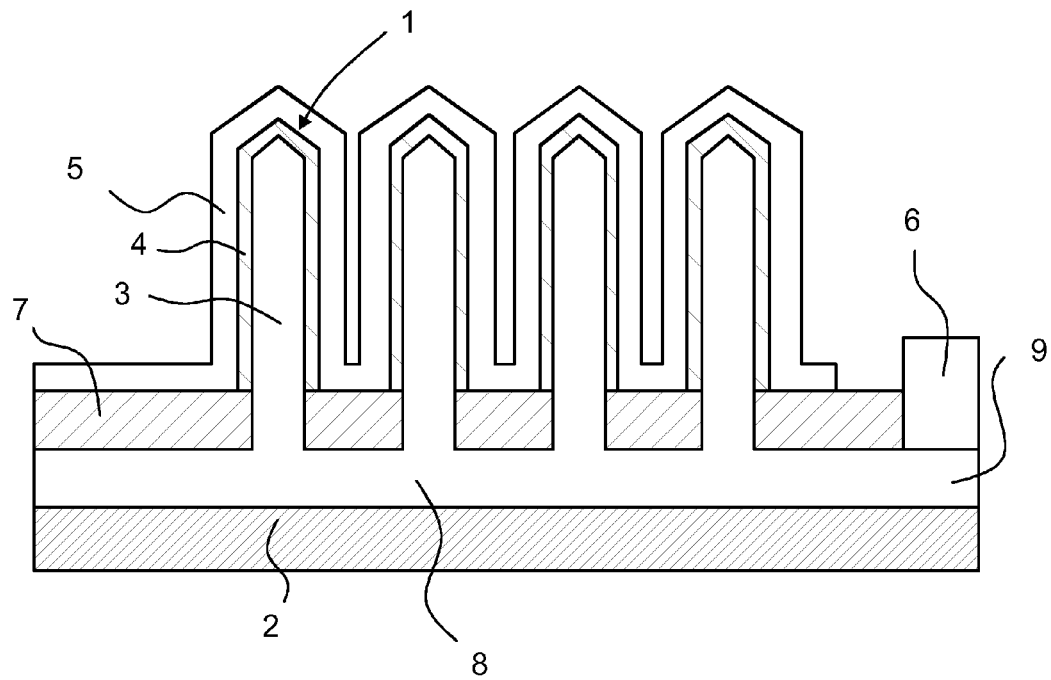

The above embodiments described with reference to FIG. 1-2 can be referred to as having substantially axial metal-semiconductor junctions, whereas the following embodiments described with reference to FIG. 3-6 has substantially radial metal-semiconductor junctions in a core-shell configuration or with a semiconductor nanowire having an axially varying doping level. Such a radial Schottky device in accordance with the invention comprises at least one semiconductor nanowire 1, or as illustrated in FIG. 3 an array of semiconductor nanowires, and a first metal contact 5, where a metal-semiconductor junction between each semiconductor nanowire 1 and the first metal contact 5 forms a Schottky barrier. The first metal contact 5 is arranged on each semiconductor nanowire 1 such that it at least partly encloses a circumferential area of each semiconductor nanowire 1 along the length thereof.

Referring to FIG. 3, the semiconductor nanowire 1 comprises a nanowire core 3 and a shell 4. The shell 4 surrounds the nanowire core 3 at least in the circumferential area that is enclosed by the first metal contact 5 and the nanowire core 3 has a significantly higher doping level than the shell 4 such that essentially the nanowire core 3 functions as a conductor and the shell 4 or part thereof functions as a depletion region of the Shottky barrier.

By way of example the nanowire core 3 comprises of highly doped III-V material, such as n++-type GaN. Onto the highly doped nanowire core 3, a shell 4 of III-V material having a significantly lower degree of doping, such as n-type GaN, is grown. The first metal contact is arranged on the shell 4, thus together with the sparsely doped semiconductor forming the Schottky barrier in the semiconductor nanowire 1. The core 3 of the semiconductor nanowire 1 works as a conductor, i.e., exhibits low resistance. The material sequence may be, Me//n-type III-V shell/n++-type III-V core/n++-type III-V buffer layer. Both the highly doped nanowire core 3 and the highly doped buffer layer acts as electrode. A dielectric spacer will again be required to insulate the first metal contact 5 from the buffer layer 9 and from the base of the semiconductor nanowires 1.

Figure 4:
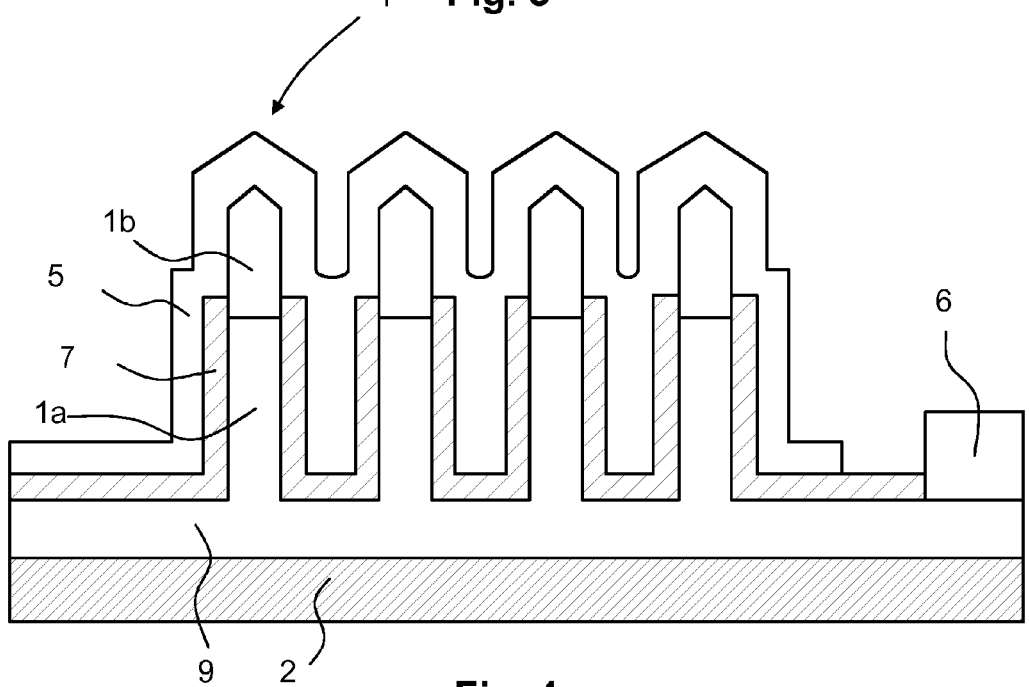
Figure 5:
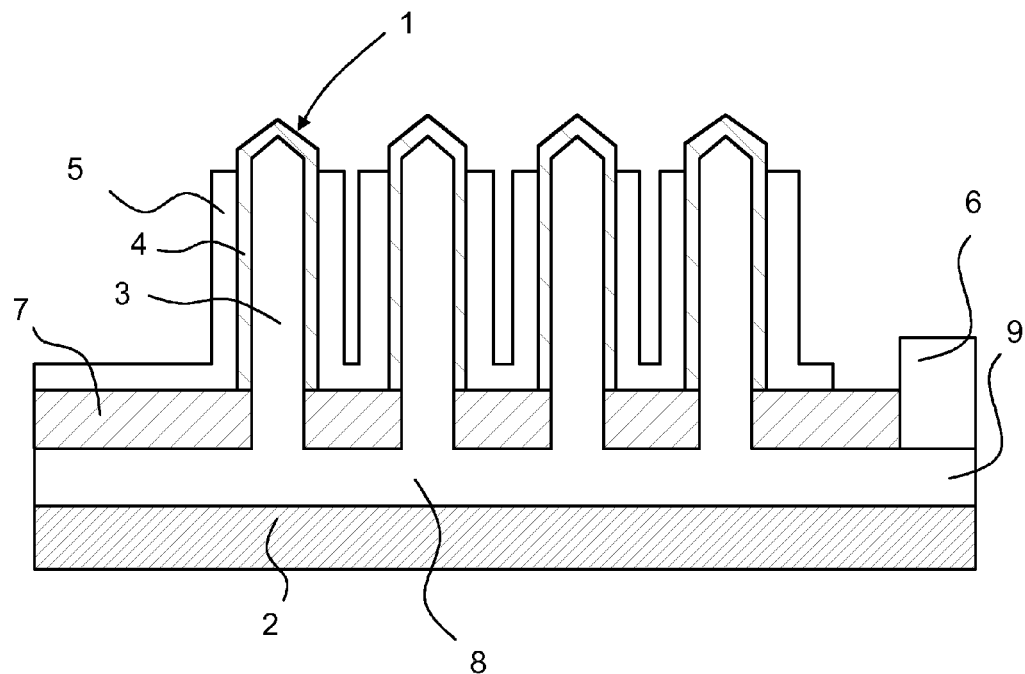
Figure 6:
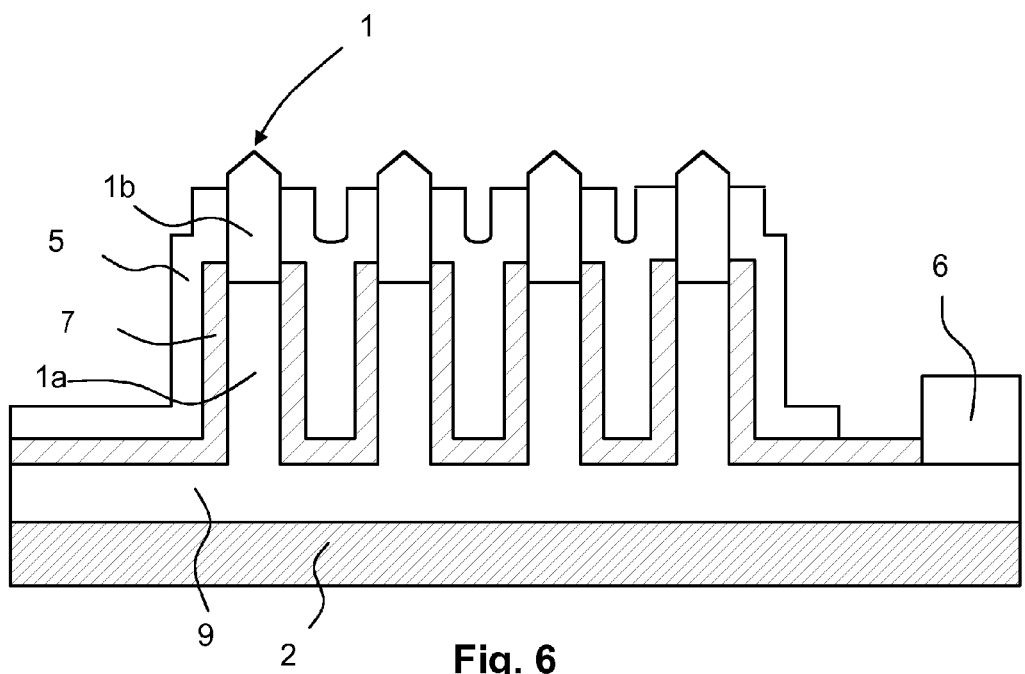

In another embodiment of the present invention according to FIG. 4 the device has a radial design with a varying doping level in the semiconductor nanowire 1. By way of example, the nanowire 1 is first grown axially in order to form a first segment 1a comprising of a highly doped III-V material. Thereafter at least a second segment 1b of a III-V material with a low doping level is grown onto the first segment 1a in the axial direction. The first metal contact 5 is then arranged onto the second segment 1b of the semiconductor nanowire such that the first metal contact 5 at least covers a circumferential area of the second segment 1b and is isolated from the first segment 1a and the substrate 2. This forms e.g. the material sequence Me//n-type III-V nanowire segment/n++-type III-V nanowire segment/n++-type buffer layer.

The radial design of the nanowire Schottky device according to the invention has several advantages. The growth conditions for axial growth and radial growth are different. Axial or nanowire growth is enabled by increasing migration path lengths of growth molecules on the crystal surface, usually by decreasing V/III ratio, i.e. the axial growth phase utilizes a significantly lower V/III material ratio than the radial growth phase, as disclosed in WO 2008/085129, or decreasing total growth pressure. A disadvantage of these adaptations of growth conditions increases incorporation of impurity atoms and column V vacancies. This results in higher background doping and deep level defects in the material and may deteriorate the possibility to achieve low doped material with acceptable semiconductor properties Thus the radial design enables a larger variation of the doping level during growth and it is easier to control the doping level of the semiconductor material adjacent to the metal-semiconductor junction than in an axial design.

Basically a method for forming a device comprising at least one semiconductor nanowire 1 and a first metal contact 5, where a metal-semiconductor junction between the semiconductor nanowire 1 and the first metal contact 5 forms a Schottky barrier comprises:
  in a first step, axially growing a nanowire core 3 in order to form a template for formation of the metal-semiconductor junction, wherein the template is substantially free from threading dislocations and stacking faults;
  in a second step, switching growth mode, and radially growing a shell 4 on the nanowire core 3; and
  providing a first metal contact 5 on the shell, wherein the first metal contact 5 at least encloses a circumferential area of each semiconductor nanowire 1 along the length thereof.

The first step enables a growth of a defect-free material in terms of threading dislocations and stacking faults. There is still a small probability of this kind of defects, however, in a large population of nanowires the presence of such defects will be negligible. When switching to radial growth the shell epitaxially inherits the advantageous properties of the template, i.e. lack of defects such as threading dislocations and stacking faults, while impurity and vacancy levels are decreased. This enables a wider span of potential doping levels while maintaining the advantageous properties mentioned above. As mentioned above the radial growth phase typically utilizes a significantly higher V/III material ratio than the axial growth phase. Examples of V/III ratios can be found in WO 2008/085129. The radial growth can also be repeated with different material compositions, doping, etc, giving a shell-like structure with multilayer or graded configuration.

One advantage in using selective growth area techniques, i.e. catalyst-free growth techniques, for growing the semiconductor nanowires of the invention is that the chemistry of the catalytic process does not have to be considered when the growth conditions are adapted for different growth mechanisms or doping.

The radial design potentially gives more robust and reliable Schottky diodes due to a larger junction surface. The junction surface can be adjusted by varying the length of the nanowires or by varying the extent of coverage of the first metal contact. When using an axial design where the metal-semiconductor junction is arranged at the very extreme of the semiconductor nanowires 1 the risk for short-circuiting is higher.

Due to the radial design the footprint of the Schottky device becomes much smaller than possible with prior art technology and thus the packing density can becomes at least 5 times higher than the packing density of planar technology.

The optimal dimensions of the nanowire are determined by the width of the depletion region which depends on the doping level of the semiconductor region adjacent to the metal-semiconductor junction. For the embodiments of FIGS. 1 and 2 the nanowire is lowly doped over the whole width and depletion takes place in this lowly doped region. For the radial design the lowly doped region is preferably comprised in the shell layer 4 and the highly doped core 3 act as a conductor. The diameter of the nanowire core 3 is then of minor importance, whereas the thickness of the lowly doped region in the shell layer 4 have a large influence on the properties. The nanowire diameter typically range from 5 nm to 150 nm, but may be as large as 500 nm, and the optimal diameter may vary depending on the design and intended use of the device. Since nanowires may have various cross-sectional shapes the diameter is intended to refer to an effective diameter.

Details of the method with regards to III and V material precursors for the axial and radial growth are not given in this application since these are known in the art. Depending of choice of the III-V material different precursors are available. Different precursors will lead to different appropriate values of the flow rates, and hence the V/III-ratio will need to be adjusted accordingly. Such adjustments can be made by the skilled person based on teachings given above and in the prior art.

The semiconductor nanowires 1 of the device of the invention may be grown at predetermined positions or areas in compliance with a predetermined device layout. The pattern may be defined using lithographic processes.

As mentioned above, a dielectric spacer 7 is arranged to isolate the first metal contact 5 from the substrate 2. When applying a sufficiently high voltage between the first and the second contacts 5, 6, the voltage determined by the material and thickness of the dielectric spacer 3, an electrical breakdown causes free flow of electrical current through the device. The dielectric spacer 7 is arranged to prevent the electrical breakdown, and is adapted to resist a certain potential difference. One example of a dielectric spacer, however not limited to this, is a layer of silicon dioxide that needs to be greater than 1000 nm thick to resist a voltage of 1 kV, assuming a breakdown field of 1V per nm dielectric.

The substrate 2, or at least a part thereof forming a through-substrate via, may be doped to very high doping levels, according to the definition of a high doping level below, to achieve electrically conducting properties. This enables placing of the first metal contact 5 on a first side of the substrate 2, and the second contact 6 on a second side of the substrate 2.

The buffer layer 9, which may be arranged to partially or completely cover the substrate 2, is chosen depending on the material desired for the nanowire growth. Suitable materials for the semiconductor nanowires 1 include, but are not limited to: GaN, InN, InP, GaAs, GaP and ternary and quaternary phases thereof such as AlInGaN, AlGaN, InGaN, InAsP, InGaP, InGaAs, etc. Accordingly suitable materials for the buffer layer 9 are the same. In the choice of material the cost is an issue. The substrate 2 preferably includes a III-V material. More specifically, suitable materials for the substrate 2 include, but are not limited to: Si, SiC $Si_3N_4$, $Al_2O_3$, MgO. Suitable materials for the first metal contact 5 more specifically include, but are not limited to: Mg, Hf, Ag, Al, W, Au, Pd, Ni or Pt. According to common nomenclature regarding chemical formula, a compound consisting of an element A and an element B is commonly denoted AB, which should be interpreted as $A_xB_{1-x}$.

A highly doped material for the purpose of this application preferably has a doping level in the excess of $5 \cdot 10^{17}$ and more preferably in the excess of $1 \cdot 10^{18}$. A material having a low doping level for the purpose of this application preferably has a doping level below $1\cdot10^{17}$, more preferably a doping level below $1\cdot10^{16}$, even more preferably a doping level below $1\cdot10^{15}$, and most preferably a doping level below $1\cdot10^{14}$.

Although the present invention have been described in terms of "top", "vertical", "lateral", "width", "length" and the like, the physical orientation in space of the device is not of importance. These terms are only used to describe the inter-relations between different features of the device.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. A device comprising at least one III-V semiconductor nanowire and a first metal contact, wherein:
   the device is a Schottky diode;
   a metal-semiconductor junction between the semiconductor nanowire and the first metal contact forms a Schottky barrier, wherein the first metal contact at least partly encloses a circumferential area of each semiconductor nanowire;
   wherein the semiconductor nanowire comprises:
   a highly doped nanowire core substantially free from threading dislocations, and that provides a template for formation of the metal-semiconductor junction, and
   a shell that surrounds the nanowire core at least in a circumferential area that is enclosed by the first metal contact, the shell having a lower doping concentration than the nanowire core such that at least a portion of the shell functions as a depletion region of the Schottky barrier.

2. The device of claim 1, wherein the semiconductor nanowire comprises a first segment and a second segment, the first segment has a significantly higher doping level than the second segment and the first metal contact and the second segment provides the metal-semiconductor junction.

3. The device of claim 1, wherein the first metal contact is truncated so as to leave one end of the semiconductor nanowire uncovered.

4. The device of claim 1, wherein the semiconductor nanowire protrudes from a semiconductor substrate.

5. The device of claim 4, wherein the substrate comprises Si.

6. The device of claim 4, wherein the semiconductor substrate comprises a buffer layer comprising a III-V semiconductor material adjacent to the semiconductor nanowire.

7. The device of claim 6, wherein the buffer layer comprises GaN, InN, InGaN, InP, GaAs or GaP.

8. The device of claim 4, wherein a dielectric spacer is arranged between the first metal contact and the semiconductor substrate.

9. The device of claim 8, wherein the dielectric spacer extends partly along the length of the semiconductor nanowire up to the metal-semiconductor junction.

10. The device of claim 1, wherein the first metal contact comprises Au, Pd, Ni, Pt, or a combination thereof.

11. The device of claim 1, wherein the semiconductor nanowire comprises GaN, GaAs, GaInN or GaP.

12. The device of claim 1, wherein the device comprises a plurality of semiconductor nanowires in an array electrically connected in parallel by the first metal contact.

13. A device comprising at least one III-V semiconductor nanowire and a first metal contact, wherein:
   a metal-semiconductor junction between the semiconductor nanowire and the first metal contact forms a Schottky barrier, wherein the first metal contact at least partly encloses a circumferential area of each semiconductor nanowire;
   wherein the semiconductor nanowire comprises:
   a highly doped nanowire core substantially free from threading dislocations, and that provides a template for formation of the metal-semiconductor junction, and
   a shell that surrounds the nanowire core at least in a circumferential area that is enclosed by the first metal contact, the shell having a lower doping concentration than the nanowire core such that at least a portion of the shell functions as a depletion region of the Schottky barrier;
   wherein:
   the core comprises a first conductivity type semiconductor;
   the shell comprises the first conductivity type semiconductor and contacts the core; and
   the first metal contact contacts the shell.

14. The device of claim a 13, wherein the device is a Schottky diode.

15. A device comprising at least one III-V semiconductor nanowire and a first metal contact, wherein:
   a metal-semiconductor junction between the semiconductor nanowire and the first metal contact forms a Schottky barrier, wherein the first metal contact at least partly encloses a circumferential area of each semiconductor nanowire;
   wherein the semiconductor nanowire comprises:
   a highly doped nanowire core substantially free from threading dislocations, and that provides a template for formation of the metal-semiconductor junction; and
   a shell that surrounds the nanowire core at least in a circumferential area that is enclosed by the first metal contact, the shell having a lower doping concentration than the nanowire core such that at least a portion of the shell functions as a depletion region of the Schottky barrier;
   wherein:
   the semiconductor nanowire protrudes from a semiconductor substrate; and
   wherein the semiconductor substrate comprises a buffer layer comprising a III-V semiconductor material adjacent to the semiconductor nanowire.

16. A method for forming a device comprising a Schottky barrier formed by a metal-semiconductor junction between a semiconductor nanowire and a metal contact, the method comprising:
   in a first step, axially growing a nanowire core in order to form a template for formation of the metal-semiconductor junction;
   in a second step, switching growth mode, and radially growing a shell on the nanowire core; and
   providing a first metal contact on the shell, the shell having a lower doping concentration than the nanowire core such that at least a portion of the shell functions as a depletion region of the Schottky barrier; wherein the device is a Schottky diode.

17. The method of claim 16, wherein the nanowire core is doped to a significantly higher doping level than the shell.

18. A method for forming a device comprising a Schottky barrier formed by a metal-semiconductor junction between a semiconductor nanowire and a metal contact, the method comprising:
   in a first step, axially growing a nanowire core in order to form a template for formation of the metal-semiconductor junction;
   in a second step, switching growth mode, and radially growing a shell on the nanowire core;

providing a first metal contact on the shell, the shell having a lower doping concentration than the nanowire core such that at least a portion of the shell functions as a depletion region of the Schottky barrier;
wherein:
the core comprises a first conductivity type semiconductor;
the shell comprises the first conductivity type semiconductor and contacts the core; and
the first metal contact contacts the shell.

19. The method of claim 18, wherein the device is a Schottky diode.

* * * * *